United States Patent
Sandhu et al.

(10) Patent No.: US 8,962,387 B2
(45) Date of Patent: Feb. 24, 2015

(54) METHODS OF FORMING MEMORY CELLS

(71) Applicant: Micron Technology, Inc., Boise, ID (US)

(72) Inventors: Gurtej S. Sandhu, Boise, ID (US); Bhaskar Srinivasan, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/053,847

(22) Filed: Oct. 15, 2013

(65) Prior Publication Data
US 2014/0051208 A1   Feb. 20, 2014

Related U.S. Application Data

(62) Division of application No. 13/355,382, filed on Jan. 20, 2012, now Pat. No. 8,581,224.

(51) Int. Cl.
*H01L 21/00* (2006.01)
*H01L 45/00* (2006.01)

(52) U.S. Cl.
CPC .............. *H01L 45/145* (2013.01); *H01L 45/08* (2013.01); *H01L 45/1233* (2013.01); *H01L 45/146* (2013.01); *H01L 45/1608* (2013.01)
USPC ........... 438/104; 438/381; 438/382; 438/722; 257/4; 257/E45.002; 257/E45.003

(58) Field of Classification Search
USPC .................. 438/104, 381, 382, 722; 257/4, 257/E45.002, E45.003
See application file for complete search history.

(56) References Cited

U.S. PATENT DOCUMENTS

| | | | |
|---|---|---|---|
| 6,524,867 B2 | 2/2003 | Yang et al. |
| 7,236,389 B2 | 6/2007 | Hsu |
| 7,273,791 B2 | 9/2007 | Basceri et al. |
| 7,393,785 B2 | 7/2008 | Uhlenbrock et al. |
| 7,446,010 B2 | 11/2008 | Li et al. |
| 7,471,556 B2 | 12/2008 | Chow et al. |

(Continued)

FOREIGN PATENT DOCUMENTS

| | | |
|---|---|---|
| JP | 2008-235427 | 10/2008 |
| JP | 2009-130344 | 6/2009 |

(Continued)

OTHER PUBLICATIONS

Choi et al., "Defect Structure and Electrical Properties of Single-Crystal Ba0.03Sr0.97TiO3", Journal of American Ceramics Society, 71(4), pp. 201-205, 1988.

(Continued)

*Primary Examiner* — Andy Huynh
(74) *Attorney, Agent, or Firm* — Wells St. John P.S.

(57) ABSTRACT

Some embodiments include methods of forming memory cells in which a metal oxide material is formed over a first electrode material, an oxygen-sink material is formed over and directly against the metal oxide material, and a second electrode material is formed over the oxygen-sink material. The second electrode material is of a different composition than the oxygen-sink material. The metal oxide material is treated to transfer oxygen from a region of the metal oxide material to the oxygen-sink material and thereby subdivide the metal oxide material into at least two regions, with one of the regions nearest the oxygen-sink material being relatively oxygen depleted relative to another of the regions.

16 Claims, 4 Drawing Sheets

(56) References Cited

U.S. PATENT DOCUMENTS

| | | |
|---|---|---|
| 7,544,987 B2 | 6/2009 | Lu et al. |
| 7,560,815 B1 | 7/2009 | Vaartstra et al. |
| 7,639,523 B2 | 12/2009 | Celinska et al. |
| 7,727,908 B2 | 6/2010 | Ahn et al. |
| 7,764,160 B2 | 7/2010 | Kawano et al. |
| 8,188,833 B2 | 5/2012 | Tsuji |
| 8,432,720 B2 | 4/2013 | Awaya et al. |
| 8,488,365 B2 | 7/2013 | Liu |
| 8,526,213 B2 | 9/2013 | Meade |
| 2006/0157679 A1 | 7/2006 | Scheuerlein |
| 2007/0010082 A1 | 1/2007 | Pinnow et al. |
| 2007/0224770 A1 | 9/2007 | Nagashima |
| 2007/0268737 A1 | 11/2007 | Hidaka |
| 2008/0043519 A1 | 2/2008 | Kitagawa et al. |
| 2008/0165566 A1 | 7/2008 | Park et al. |
| 2008/0247219 A1 | 10/2008 | Choi et al. |
| 2008/0298143 A1 | 12/2008 | Chen et al. |
| 2008/0308783 A1 | 12/2008 | Ahn et al. |
| 2009/0201715 A1 | 8/2009 | Kreupl |
| 2009/0218565 A1 | 9/2009 | Kawano et al. |
| 2010/0133496 A1 | 6/2010 | Lee et al. |
| 2010/0237442 A1 | 9/2010 | Li et al. |
| 2010/0315760 A1 | 12/2010 | Krishnan et al. |
| 2011/0069529 A1 | 3/2011 | Srinivasan et al. |
| 2011/0240942 A1 | 10/2011 | Tsuji |
| 2011/0317472 A1 | 12/2011 | Awaya et al. |

FOREIGN PATENT DOCUMENTS

| | | |
|---|---|---|
| KR | 2007/0111840 | 11/2007 |
| KR | 2007/0118865 | 12/2007 |
| WO | 2009/127187 | 10/2009 |
| WO | 2010/082923 | 7/2010 |
| WO | WO 2010/082928 | 7/2010 |
| WO | WO 2010/085241 | 7/2010 |
| WO | 2010/068221 | 8/2010 |
| WO | WO 2010/087854 | 8/2010 |
| WO | PCT/2010/045856 | 4/2011 |
| WO | PCT/US2010/045856 | 4/2011 |
| WO | WO 2011/096940 | 8/2011 |
| WO | PCT/US2010/045856 | 3/2012 |
| WO | PCT/US2012/071026 | 4/2013 |

OTHER PUBLICATIONS

Driscoll et al., "Phase-transition driven memristive system", Applied Physics Letters (Online), vol. 95(4), Jul. 2009.

Hummer et al., "Origin of Nnaoscale Phase Stability Reversals in Titanium Oxide Polymorphs", The Journal of Physics Chemistry C, vol. 113(11), Feb. 2009, pp. 4240-4245, Abstract Only.

Kamalanathan et al., "ON State Stability of Programmable Metalization Cell (PMC) Memory", IEEE, 2007, pp. 91-95.

Kau et al., "A stackable cross point phase change memory", IEEE, 2009, pp. 27.1.1-27.1.4.

Kozicki et al., "Electrodeposit Formation in Solid Electrolytes", IEEE, 2006, pp. 111-115.

Kozicki et al., "Nanoscale Memory Elements Based on Solid-State Electrolytes", IEEE, 4(3), 2005, pp. 331-338.

Kozicki et al., "Programmable Metallization Cell Memory Based on Ag—GE—S and Cu—Ge—S Solid Electrolytes", IEEE, 2005, pp. 83-89.

Lee et al., "2-stack 1D-1R Cross-point Structure with Oxide Diodes as Switch Elements for High Density Resistance RAM Applications", IEEE, 2007, pp. 771-774.

Meyer et al., "Oxide Dual-Layer Memory Element for Scalable Non-Volatile Cross-Point Memory Technology", IEEE, 2005, 5 pages.

Stampfl et al., "Theoretical investigation of native defects, impurities, and complexes in aluminum nitride", Physical Review B, 65(15), pp. 155212-1 to 155212-10.

Strukov et al., "Exponential ionic drift: fast switching and low volatility of thin-film memristors", Applied Physics A, 2009, 94, pp. 515-519.

METHODS OF FORMING MEMORY CELLS

RELATED PATENT DATA

This patent resulted from a divisional of U.S. patent application Ser. No. 13/355,382, which was filed Jan. 20, 2012, which issued as U.S. Pat. No. 8,581,224, and which is hereby incorporated herein by reference.

TECHNICAL FIELD

Memory cells and methods of forming memory cells.

BACKGROUND

Memory is one type of integrated circuitry, and is used in computer systems for storing data. Integrated memory is usually fabricated in one or more arrays of individual memory cells. The memory cells may be volatile, semi-volatile, or nonvolatile. Nonvolatile memory cells can store data for extended periods of time, and in some instances can store data in the absence of power. Volatile memory dissipates and is therefore refreshed/rewritten to maintain data storage.

The memory cells are configured to retain or store memory in at least two different selectable states. In a binary system, the states are considered as either a "0" or a "1". In other systems, at least some individual memory cells may be configured to store more than two levels or states of information.

There is a continuing effort to produce smaller and denser integrated circuits. The smallest and simplest memory cell will likely be comprised of two electrically conductive electrodes having a programmable material received between them. Such memory cells may be referred to as cross-point memory cells.

Programmable materials suitable for utilization in cross-point memory will have two or more selectable and electrically differentiable memory states. The multiple selectable memory states can enable storing of information by an individual memory cell. The reading of the cell comprises determination of which of the memory states the programmable material is in, and the writing of information to the cell comprises placing the programmable material in a predetermined memory state. Some programmable materials retain a memory state in the absence of refresh, and thus may be incorporated into nonvolatile memory cells.

Significant interest is presently being directed toward programmable materials that utilize ions as mobile charge carriers. The programmable materials may be converted from one memory state to another by moving the mobile charge carriers therein to alter a distribution of charge density within the programmable materials. Memory devices that utilize migration of mobile charge carriers to transition from one memory state to another are sometimes referred to as Resistive Random Access Memory (RRAM) cells. Example RRAM cells are memristors, which may utilize an oxide (for instance, titanium oxide) as a programmable material, and which may utilize oxygen migration within such programmable material as a mechanism for transitioning from one memory state to another.

There can be difficulties associated with the formation of memristors and other RRAM cells. Accordingly, it would be desirable to develop new methods of forming memristors and RRAM cells.

DETAILED DESCRIPTION OF THE ILLUSTRATED EMBODIMENTS

Some embodiments include new methods of forming memristor or other RRAM cells, and some embodiments include new memory cell architectures. Example embodiments are described with reference to FIGS. 1-7.

Figure 1:
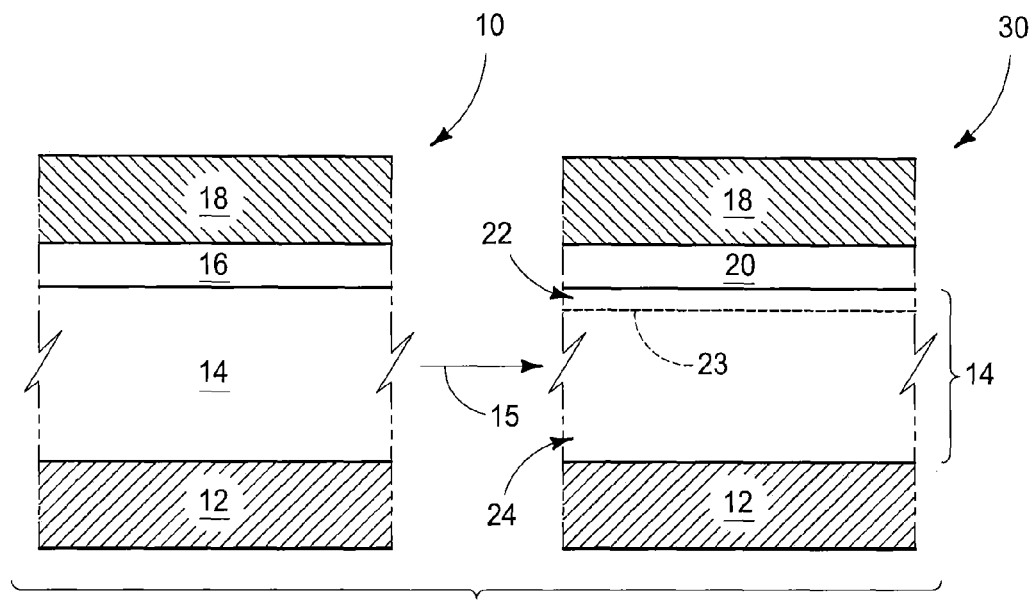
FIG. 1 diagrammatically illustrates a process stage of an example embodiment method of forming a memory cell.

Referring to FIG. 1, a structure 10 is diagrammatically illustrated in cross-sectional side view, and is shown subjected to a treatment (represented by the arrow 15) which converts the structure 10 into a memory cell 30.

The structure 10 comprises an electrode material 12, a metal oxide material 14 over the electrode material, an oxygen-sink material 16 over the metal oxide material, and another electrode material 18 over the oxygen-sink material.

The electrode materials 12 and 18 may be referred to as first and second electrode materials, respectively, to distinguish such electrode materials from one another. The electrode materials 12 and 18 may comprise the same composition as one another, or different compositions. The electrode materials 12 and 18 may comprise any suitable electrically conductive compositions or combinations of compositions. In some embodiments, one or both of the electrode materials may comprise, consist essentially of, or consist of a noble metal; such as, for example, platinum or palladium. In some embodiments, one or both of the electrode materials may comprise copper. In such embodiments, the copper may be surrounded by appropriate copper barrier material (for instance, a ruthenium-containing material, Ta, TaN, TiN, etc.) to alleviate or prevent copper migration.

The electrode materials 12 and 18 may be electrically coupled with access/sense lines (e.g., wordlines and bit lines). For instance, the electrode material 12 may be part of a first access/sense line that extends into and out of the page relative to the FIG. 1 view of structure 10, and the electrode material 18 may be part of a second access/sense line that extends substantially orthogonally to the first access/sense line. Accordingly, the metal oxide 14 may be at a region where the first and second access/sense lines overlap, and thus may be incorporated into a cross-point memory cell in some embodiments.

In the shown embodiment, metal oxide material 14 is directly against electrode material 12, oxygen-sink material 16 is directly against metal oxide material 14, and electrode material 18 is directly against oxygen-sink material 16. In other embodiments, one or more other materials may be incorporated into the memory cell so that one or more of the illustrated direct-contact relationships is altered. For instance, in some embodiments electrode material 12 may be a noble metal, and another material (for instance, a metal silicide or a metal nitride) may be provided between the metal oxide 14 and the electrode material 12 to improve adherence between the metal oxide and the noble metal.

The metal oxide material 14 may comprise any suitable composition or combination of compositions; and in some embodiments may comprise, consist essentially of, or consist of a composition selected from the group consisting of aluminum oxide, tantalum oxide, titanium oxide, nickel oxide, hafnium oxide and zirconium oxide.

The oxygen-sink material may comprise any suitable composition or combination of compositions; and in some embodiments may comprise, consist essentially of, or consist of a metal selected from the group consisting of ruthenium, nickel, iridium, titanium and tantalum.

The materials 12, 14, 16 and 18 may be formed with any suitable processing, including, for example, one or more of atomic layer deposition (ALD), chemical vapor deposition (CVD) and physical vapor deposition (PVD).

The conversion from structure 10 to memory cell 30 comprises transferring oxygen from metal oxide 14 into the oxygen-sink material 16. The transfer transforms oxygen-sink material 16 into an oxide 20, and forms an oxygen-depleted region 22 within the metal oxide 14.

In some embodiments, oxygen-sink material 16 comprises, consists essentially of, or consists of metal; and thus oxide 20 may comprise, consist essentially of, or consist of metal oxide. In such embodiments, the metal oxides 14 and 20 of memory cell 30 may be referred to as first and second metal oxides, respectively, to distinguish such metal oxides from one another. In some embodiments, metal oxide 20 may comprise, consist essentially of, or consist of ruthenium oxide, iridium oxide, nickel oxide, tantalum oxide or titanium oxide. In the shown embodiment, and entirety of the oxygen-sink material 16 of structure 10 is converted to oxide 20 during formation of memory cell 30. Other embodiments may have less than an entirety of the oxygen-sink material converted to oxide.

The formation of the oxygen-depleted region 22 subdivides the metal oxide 14 into two regions 22 and 24. A dashed line 23 is provided to diagrammatically illustrate an approximate boundary, or interface, between such regions. The region 24 retains the initial stoichiometry of the metal oxide, while the region 22 has a lower concentration of oxygen due to oxygen being transferred from region 22 into the oxygen-sink material 16 to form oxide 20. Although the metal oxide is subdivided into two regions in the shown embodiment, in other embodiments the metal oxide may be subdivided into more than two regions and/or there may be a gradual change in oxygen concentration rather than the illustrated abrupt interface.

Figure 2:
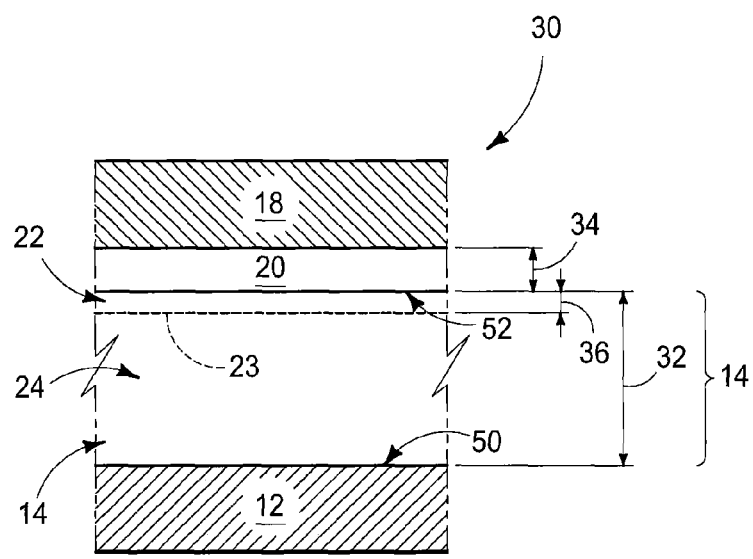
FIG. 2 diagrammatically illustrates an example embodiment memory cell.

FIG. 2 shows another view of the example embodiment memory cell 30. The metal oxide material 14 may have an overall thickness (shown as 32) within a range of from about 2 nanometers (nm) to about 10 nm; the metal oxide material 20 may have a thickness (shown as 34) of less than or equal to about 4 nm (for instance, a thickness within a range of from about 1 nm to about 4 nm); and the oxygen-depleted region 22 of the metal oxide 14 may have a thickness (shown as 36) of less than or equal to about 3 nm, such as a thickness within a range of from about 0.5 nm to about 3 nm.

In some embodiments, the thickness of the oxygen-depleted region 22 may be determined by the initial thickness of the oxygen-sink material 16 of the structure 10 of FIG. 1. Specifically, an entirety of the oxygen-sink material may be converted to metal oxide 20. Thus, the amount of oxygen consumed by the oxygen-sink material 16 is dictated by the initial thickness of the oxygen-sink material; or in other words, the depletion region 22 is formed in a self-limiting process (with such process being limited by the initial thickness of material 16). A difficulty in prior art processes of forming memristor cells occurs in attempting to uniformly tailor the relative thickness of an oxygen-depleted region of metal oxide to a non-oxygen-depleted region of the metal oxide across multiple memory cells of a memory array. Utilization of the oxygen-sink material 16 to form depletion region 22 may overcome such prior art difficulty by linking the thickness of the depletion region to the initial thickness of the oxygen-sink material. Thus, some embodiments take advantage of the relative simplicity of depositing the oxygen-sink material to a desired thickness which is uniform across numerous structures of an array, as opposed to trying to directly deposit an oxygen-depleted region of an oxide.

The oxygen-sink material 16 may be formed to be quite thin. For instance, in some embodiments the material 16 may have a thickness of from about 0.5 nm to about 4 nm; and in some embodiments may have a thickness of about one atomic layer.

The conversion from structure 10 of FIG. 1 to memory cell 30 may be a thermodynamically-favored process such that the treatment 15 of FIG. 1 is substantially irreversible (or even entirely irreversible), at least relative to subsequent conditions that memory cell 30 is exposed to during the intended use of the memory cell.

The treatment 15 of FIG. 1 may comprise any suitable treatment. In some embodiments, the treatment may comprise a thermal treatment; such as, for example, a treatment in which the metal oxide material 14 and oxygen-sink material 16 are subjected to a temperature of at least about 200° C. (for instance, a temperature of from about 200° C. to about 500° C.). In some embodiments, the treatment may comprise an electrical treatment alternatively to, or in addition to, the thermal treatment. The electrical treatment may comprise flow of electrical current across metal oxide material 14 and oxygen-sink material 16 to ultimately transfer oxygen from the metal oxide material 14 into the oxygen-sink material and thereby form the memory cell 30. In some embodiments, the electrical treatment may form a filament (discussed below with reference to FIG. 7) in addition to forming the oxygen-depleted region 22.

The treatment 15 utilized to form the oxygen-depleted region 22 may be conducted after formation of the electrode material 18 (as shown in FIG. 1) or prior to formation of such electrode material.

The metal oxide 20 of memory cell 30 may be electrically conductive in some embodiments (for instance, may comprise ruthenium oxide), and may be electrically insulative in other embodiments (for instance, may comprise titanium oxide). In some embodiments, it can be advantageous that the metal oxide 20 be electrically conductive. In such embodiments the primary consideration relative to the thickness of the initial metal 16 (i.e., the oxygen-sink material of structure 10 in FIG. 1) may be related to the desired thickness of the depletion region 22. In contrast, if the metal oxide 20 is electrically insulative, a consideration relative to the ultimate thickness of the metal oxide 20 may be that such metal oxide should be kept very thin so that it does not interfere with performance of memory cell 30. Thus, if oxide 20 is electrically insulative, the thickness of the initial metal 16 may be determined by two considerations; with one being the desired thickness of depletion region 22, and another being a desire to keep the electrically insulative metal oxide 20 very thin. In contrast, if oxide 20 is electrically conductive, the thickness of the initial metal 16 may be determined by only the one consideration of the desired thickness of depletion region 22.

The memory cell 30 of FIG. 2 has labels 50 and 52 at the interfaces between materials 12, 14 and 20. Such labels are utilized in FIGS. 3-6 to describe example oxygen concentration gradients that may be formed in metal oxide material 14 in various example embodiments.

Figure 3:
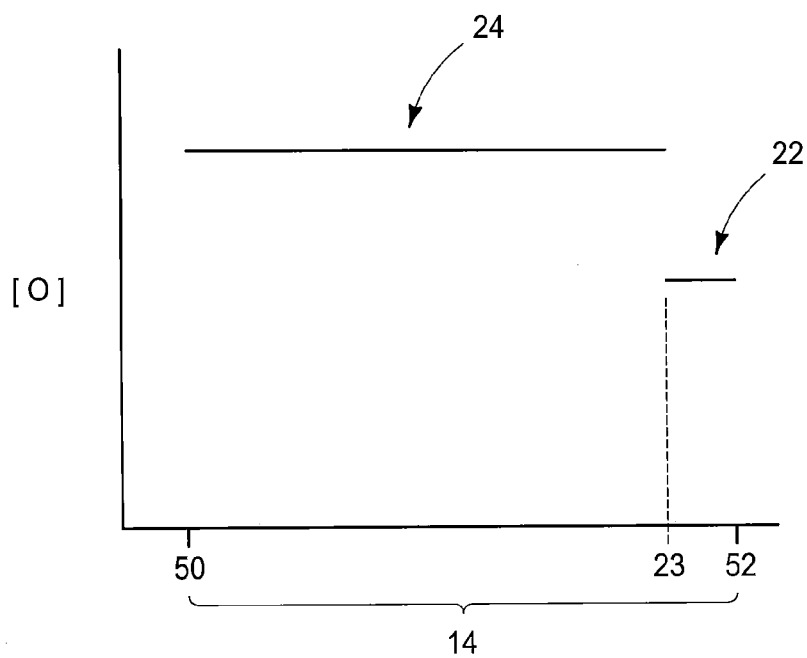
FIG. 3 graphically illustrates an oxygen concentration gradient within the FIG. 2 memory cell.

FIG. 3 graphically illustrates an oxygen concentration gradient (with the oxygen concentration being shown along the y-axis as [O]) within the material 14 of FIG. 2. Specifically, the oxygen concentration is relatively high in region 24 of metal oxide material 14, and relatively low within region 22 of the metal oxide material 14. A step occurs in the oxygen-concentration gradient across the interface 23 were region 22 meets region 24. In the illustrated embodiment, the step is abrupt. In other embodiments the step may be more gradual so that there is a taper in the oxygen-concentration gradient along interface 23, rather than the abrupt step.

Figure 4:
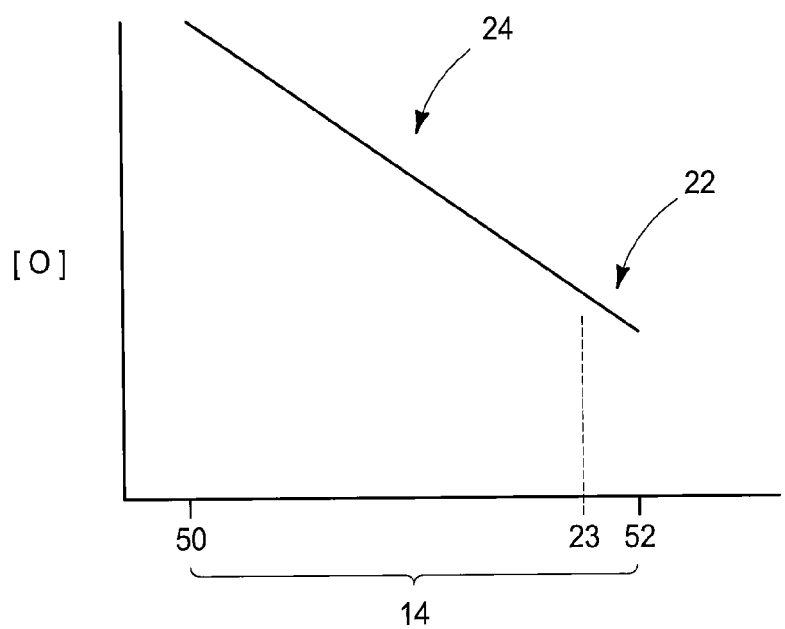
FIGS. 4-6 graphically illustrate other oxygen gradients that may be utilized in other memory cell embodiments.

FIG. 4 illustrates an embodiment in which there is a relatively high oxygen concentration in a domain of metal oxide material 14 adjacent interface 50, a relatively low oxygen concentration in a domain of metal oxide material 14 adjacent interface 52, and a substantially linear, decreasing, continuous oxygen-concentration gradient extending across an entirety of the metal oxide material 14 from the interface 50 to the interface 52.

Figure 5:
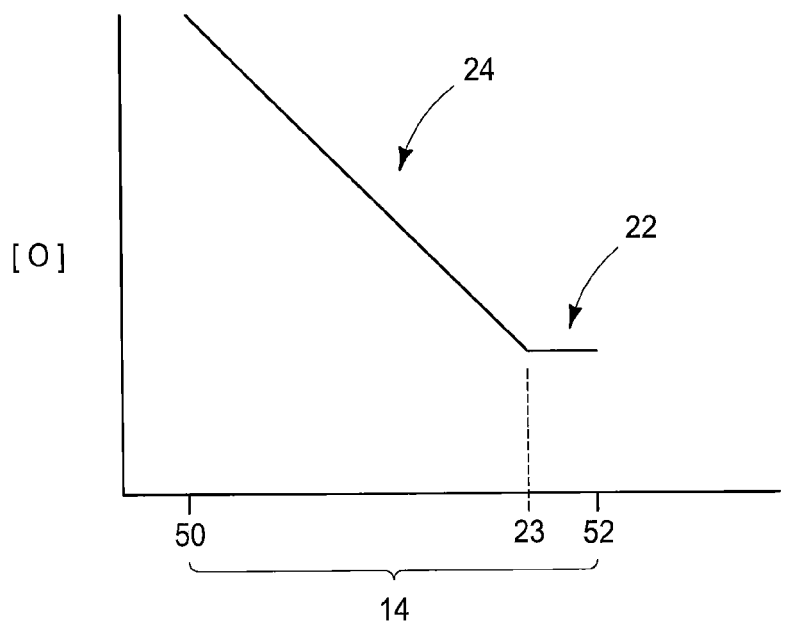

FIG. 5 illustrates an embodiment in which there is a relatively high oxygen concentration in a domain of metal oxide material 14 adjacent interface 50, a relatively low oxygen concentration in a domain of metal oxide material 14 adjacent interface 52, a flat oxygen-concentration gradient across region 22 of metal oxide 14, and a substantially linear, decreasing, continuous oxygen-concentration gradient extending across region 24 of the metal oxide material 14 from the interface 50 to the interface 23.

Figure 6:
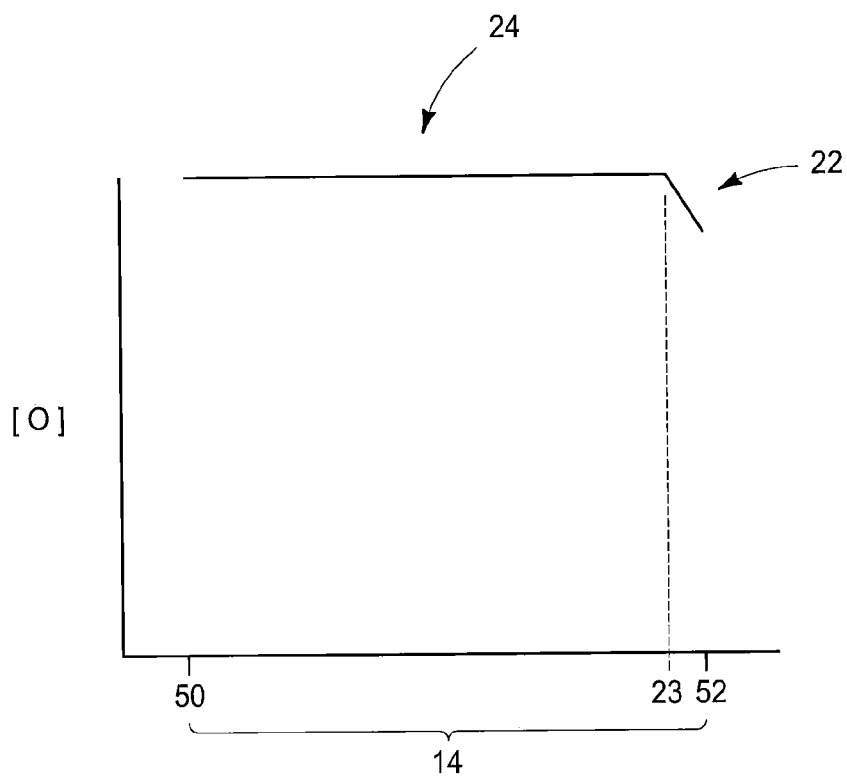

FIG. 6 illustrates an embodiment in which there is a relatively high oxygen concentration in a domain of metal oxide material 14 adjacent interface 50, a relatively low oxygen concentration in a domain of metal oxide material 14 adjacent interface 52, a flat oxygen-concentration gradient across region 24 of metal oxide 14, and a substantially linear, decreasing, continuous oxygen-concentration gradient extending across region 22 of the metal oxide material 14 from the interface 23 to the interface 52.

Figure 7:
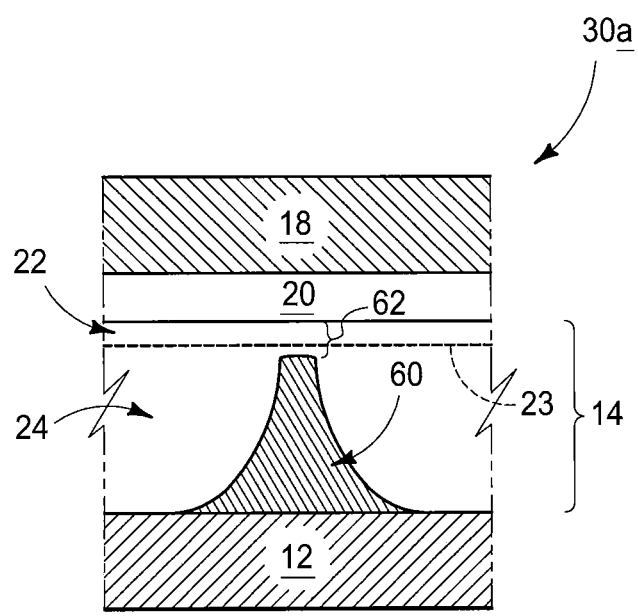
FIG. 7 diagrammatically illustrates another example embodiment memory cell.

In discussing the formation of memory cell 30 with reference to FIG. 1 above, it was indicated that some embodiments may include formation of a conductive filament within metal oxide material 14 during formation of the memory cell. FIG. 7 shows an example embodiment memory cell 30*a* comprising an electrically conductive filament 60 extending partially through metal oxide material 14. Such conductive filament may be formed by providing electrical current between electrodes 12 and 18. The conductive filament may comprise any suitable electrically conductive material, including, for example, electrode material 12 transported by the flow of the electrical current. Filaments analogous to filament 60 are known in the art for utilization in memristor cells, and it is also known in the art to electrically form such filaments during fabrication of memristor cells.

The filament 60 extends across a majority of metal oxide material 14, but does not extend entirely across the metal oxide material. Thus, a gap 62 remains between the filament and the metal oxide material 20. If the metal oxide material 20 is electrically conductive material, the gap 62 may be considered to define a programmable region of the metal oxide material 14 within the memory cell. If the metal oxide material 20 is electrically insulative, then the gap between the filament and electrically conductive structure would extend across metal oxide 20, as well as extending across the shown portion of metal oxide 14 above the filament.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell. The memory cell has a first electrode material, and has a first metal oxide material over the first electrode material. The first metal oxide material has at least two regions which differ in oxygen concentration relative to one another. One of the regions is a first region and another is a second region. The first region is closer to the first electrode material than the second region, and has a greater oxygen concentration than the second region. A second metal oxide material is over and directly against the first metal oxide material. The second metal oxide material comprises a different metal than the first metal oxide material. A second electrode material is over the second metal oxide material.

Some embodiments include a memory cell. The memory cell has a first electrode material, and has a first metal oxide material over the first electrode material. The first metal oxide material is selected from the group consisting of aluminum oxide, tantalum oxide, titanium oxide, nickel oxide, hafnium oxide and zirconium oxide. The first metal oxide material has at least two regions which differ in oxygen concentration relative to one another. One of the regions is a first region and another is a second region. The first region is closer to the first electrode material than the second region, and has a greater oxygen concentration than the second region. An electrically conductive second metal oxide material is over and directly against the first metal oxide material. A second electrode material is over and directly against the second metal oxide material.

Some embodiments include a method of forming a memory cell. A metal oxide material is formed over a first electrode material. An oxygen-sink material is formed over and directly against the metal oxide material. A second electrode material is formed over the oxygen-sink material. The metal oxide material is treated to substantially irreversibly transfer oxygen from a region of the metal oxide material to the oxygen-sink material and thereby subdivide the metal oxide material into at least two regions. One of the regions nearest the oxygen-sink material is relatively oxygen depleted relative to another of the regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory cell, comprising:
    forming a metal oxide material over a first electrode material;
    forming an oxygen-sink material over and directly against the metal oxide material;
    forming a second electrode material over the oxygen-sink material, the second electrode material being of a different composition than the oxygen-sink material; and
    treating the metal oxide material to substantially irreversibly transfer oxygen from a region of the metal oxide material to the oxygen-sink material and thereby subdivide the metal oxide material into at least two regions, with one of the regions nearest the oxygen-sink material being relatively oxygen depleted relative to another of the regions.

2. The method of claim 1 wherein the metal oxide material is selected from the group consisting of aluminum oxide, tantalum oxide, titanium oxide, nickel oxide, hafnium oxide and zirconium oxide.

3. The method of claim 1 wherein the oxygen-sink material comprises one or more metals.

4. The method of claim 1 wherein the oxygen-sink material consists of one or more metals.

5. The method of claim 4 wherein the transfer of the oxygen to the oxygen-sink material converts at least some of the oxygen-sink material into electrically conductive metal oxide.

6. The method of claim 4 wherein the transfer of the oxygen to the oxygen-sink material converts all of the oxygen-sink material into electrically conductive metal oxide.

7. The method of claim 4 wherein the transfer of the oxygen to the oxygen-sink material converts at least some of the oxygen-sink material into electrically insulative metal oxide.

8. The method of claim 4 wherein the transfer of the oxygen to the oxygen-sink material converts all of the oxygen-sink material into electrically insulative metal oxide.

9. The method of claim 1 wherein the oxygen-sink material comprises a metal selected from the group consisting of ruthenium, nickel, iridium, titanium and tantalum.

10. The method of claim 1 wherein the treating is conducted prior to forming the second electrode material.

11. The method of claim 1 wherein the treating is conducted after forming the second electrode material.

12. The method of claim 1 wherein the treating comprises a thermal treatment in which the metal oxide material and the oxygen-sink material are heated to a temperature of at least about 200° C.

13. The method of claim 12 wherein the temperature is within a range of from about 200° C. to about 500° C.

14. The method of claim 1 wherein the treating comprises passing electrical current through the metal oxide material and the oxygen-sink material.

15. The method of claim 14 wherein the treating also forms an electrically conductive filament extending across a majority of the metal oxide material, but not entirely across the metal oxide material.

16. A method of forming a memory cell, comprising:
    forming a metal oxide material over a first electrode material;
    forming an oxygen-sink material over and directly against the metal oxide material;
    forming a second electrode material over the oxygen-sink material, the second electrode material being of a different composition than the oxygen-sink material; and
    treating the metal oxide material to substantially irreversibly transfer oxygen from the metal oxide material to the oxygen-sink material and thereby form a substantially linear continuous oxygen-concentration gradient extending across an entirety of the metal oxide material; with a surface of the metal oxide material nearest the oxygen-sink material being relatively oxygen depleted relative to an opposing surface of the metal oxide material.

* * * * *